(12) United States Patent
Calmidi et al.

(10) Patent No.: US 6,622,786 B1
(45) Date of Patent: Sep. 23, 2003

(54) HEAT SINK STRUCTURE WITH PYRAMIDIC AND BASE-PLATE CUT-OUTS

(75) Inventors: Varaprasad V. Calmidi, Vestal, NY (US); Krishna Darbha, Kirkland, WA (US); Sanjeev B. Sathe, Binghamton, NY (US); Jamil A. Wakil, Binghamton, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/125,302

(22) Filed: Apr. 17, 2002

(51) Int. Cl.[7] .............................. F28F 7/00; F28F 13/08; F24H 3/06; H05K 7/20
(52) U.S. Cl. ...................... 165/185; 165/80.3; 165/147; 165/122; 361/697
(58) Field of Search ................. 165/80.3, 185, 165/905, 146, 122, 125, 147; 361/697, 703, 704; 257/722

(56) References Cited

U.S. PATENT DOCUMENTS

| | | | |
|---|---|---|---|
| 2,897,419 A | | 7/1959 | Howland et al. ............ 317/234 |
| 4,611,238 A | | 9/1986 | Lewis et al. .................... 357/81 |
| 4,688,077 A | | 8/1987 | Wakabayashi et al. ........ 357/81 |
| 5,072,787 A | * | 12/1991 | Nakamichi .................. 165/80.3 |
| 5,437,328 A | * | 8/1995 | Simons ........................ 165/146 |
| 5,491,362 A | | 2/1996 | Hamzehdoost et al. ..... 257/712 |
| 5,504,650 A | * | 4/1996 | Katsui et al. ............... 165/80.3 |
| 5,583,746 A | * | 12/1996 | Wang .......................... 361/697 |
| 5,654,587 A | | 8/1997 | Schneider et al. ........... 257/718 |
| 5,655,600 A | * | 8/1997 | Dewar et al. ................ 165/185 |
| 5,689,404 A | * | 11/1997 | Katsui ......................... 361/697 |
| 5,773,886 A | | 6/1998 | Rostoker et al. ............. 257/718 |
| 5,794,684 A | | 8/1998 | Jacoby .......................... 165/80 |
| 5,880,933 A | | 3/1999 | Markow et al. ............. 361/704 |
| 5,896,917 A | * | 4/1999 | Lemont et al. ............. 165/80.3 |
| 5,900,670 A | | 5/1999 | Schneider et al. ........... 257/718 |
| 6,025,991 A | | 2/2000 | Saito ........................... 361/704 |
| 6,097,603 A | | 8/2000 | Edwards et al. ............. 361/719 |
| 6,196,302 B1 | * | 3/2001 | Chuang ....................... 165/122 |
| 6,202,738 B1 | | 3/2001 | Tanaka et al. ................. 165/80 |
| 6,267,178 B1 | * | 7/2001 | Chen ........................... 165/185 |

FOREIGN PATENT DOCUMENTS

JP 1132146 A 5/1989 ............ H01L/23/40

OTHER PUBLICATIONS

P.M. Connors, Sep. 1974, IBM Technical Disclosure Bulletin, vol. 17 No. 4,.*
PCT/US83/00661, International Filing Date: May 5, 1983, Priority Application No.: 375,069 Priority Date: May 5, 1982, Priority Country: US, Inventors: Lewis, et al., Entitled: "Low–Stress–Inducing Omnidirectional Heat Sink", International Publication No.: WO 83/03924, International Publication Date: Nov. 10, 1983.

* cited by examiner

Primary Examiner—Henry Bennett
Assistant Examiner—Tho V Duong
(74) Attorney, Agent, or Firm—John A. Jordan; Arthur J. Samodovitz (57) ABSTRACT

A heat sink structure is formed by stacking a plurality of heat sink layers. Each layer comprises an array of vertically disposed heat dissipating elements extending from a base plate. Cut outs are formed in each of the base plates to form openings so that when the layers are stacked, each of the ascending successive layers has a larger opening than the layer upon which it rests. Cooling may be by forced air or natural convection. With forced air, air impinges on the top of the stack and into the opening in the base plates. Because of diminishing size of the openings in the stack, a portion of the air is forced out the sides of each layer. With natural convection, air is drawn into the sides of each layer and the hot air at the center flows upwardly through the openings with increasing volume as it rises.

18 Claims, 7 Drawing Sheets

HEAT SINK STRUCTURE WITH PYRAMIDIC AND BASE-PLATE CUT-OUTS

BACKGROUND OF THE INVENTION

1. Field of the Invention

The present invention relates to heat sink structures and, more articularly, to stacked heat sink structures with central openings and methods for making same.

2. Background and Related Art

The electronics industry is continuously endeavoring to reduce both the size of electronic packages and the pitch between conductive I/O contacts in order to accommodate the higher counts coming from higher density chips. With increased speed and miniaturization comes increased heat generation and its attendant problems, such as, increased failure rate of solder joints during temperature cycling due to the higher strain levels at the joints.

To reduce the levels of heat generated within electronic packages and, thus solder joint fatigue for example, various forms of heat dissipating means have been employed. One mechanism employed to facilitate heat dissipation is a heat sink positioned in thermal contact with the electronic package. Typically, the heat sink is either clamped or bonded to the semiconductor chip or cover plate.

With increasing heat generation created by smaller and denser electronic packages, improved thermal performance of heat sinks, particularly air cooled heat sinks, is required. However, with smaller electronic packaging, the thermal contact area becomes more limited. Because of the constrained X-Y contact space, heat sink structures with high aspect ratios extending further in the Z direction act to facilitate additional heat dissipation. However, manufacturing such heat sinks structures, such as tall plate fin or pin fin structures, is difficult and expensive, and the resulting structures lack flexibility in their ability to be tailored according to application. In addition, whether cooling is through forced or buoyancy-driven air cooled conditions, fins in the central portion of the heat sink typically act to provide little benefit in the cooling process.

The difficulty with known heat sink structures is that they fail to provide the thermal performance required for today's electronic packages. Moreover, such structures also fail to provide a simple, low cost, flexible approach to cooling. Typical of known stacked heat sinks are those described in U.S. Pat. No. 5,794,684 and U.S. Pat. No. 5,900,670.

SUMMARY OF THE PRESENT INVENTION

Accordingly, it is an object of the present invention to provide an improved heat sink.

It is a further object of the present invention to provide an improved heat sink structure and method for effectively dissipating heat from heat generating devices having limited thermal contact surface.

It is yet a further object of the present invention to provide an easily manufactured and readily assembled, low cost and adaptable heat sink structure and method.

It is another object of the present invention to provide a heat sink structure with improved weight/heat dissipating performance characteristics.

It is yet another object of the present invention to provide an improved heat sink structure capable of being readily adapted and extended to match the particular heat dissipating application.

In accordance with the present invention, a stacked pyramidal heat sink structure with central air passage openings is provided for improved thermal performance under either forced or buoyancy driven air cooled conditions. The heat sinks are stacked in a hierarchical arrangement with the bottom most layer having no opening or a small opening centered therein, and with each layer in the stack having a smaller opening than the opening in the next layer above it such that the openings become progressively larger as the layers build so that the top most layer has the largest centered opening. The heat sink structure may be any cooling structure having multiple vertical heat dissipating elements or surfaces extending from a base plate, such as, pin-fin, plate-fin, corrugated, and the like. It is clear that the opening in the central region of the base plate removes what would otherwise be the vertical heat dissipating elements in this region.

Convection cooling may be achieved by either forced air or buoyancy driven air cooled conditions. Under forced convection cooling, removal of fins in the central region decreases resistance to flow. Thus, for a fixed pumping power, a greater amount of flow is realized, in effect increasing the heat removed from the remaining fins. Similarly, under buoyancy-driven air cooled conditions where the heat sink base plate in contact with the heat generating surface is in a horizontal orientation, fins in the central region of the heat sink typically act to provide little benefit in the cooling process. Their removal also offers less resistance to the buoyant flow. In addition, heat sink weight is also reduced due to the removal of fins.

The stacked heat sink layers may be made from any of a variety of materials and different layers may be made of different materials with different thickness to form a composite, designed in accordance with particular application. For example, the bottom layer may be selected such that it exhibits thermomechanical properties closely matching the juxtaposed cover plate or silicon chip to avoid CTE-related mismatch effects.

These foregoing and other objects, features and advantages of the invention will be apparent from the following more particular description of a preferred embodiment of the invention, as illustrated in the accompanying drawings, wherein like reference members represent like parts of the invention.

DETAILED DESCRIPTION

Figure 1:
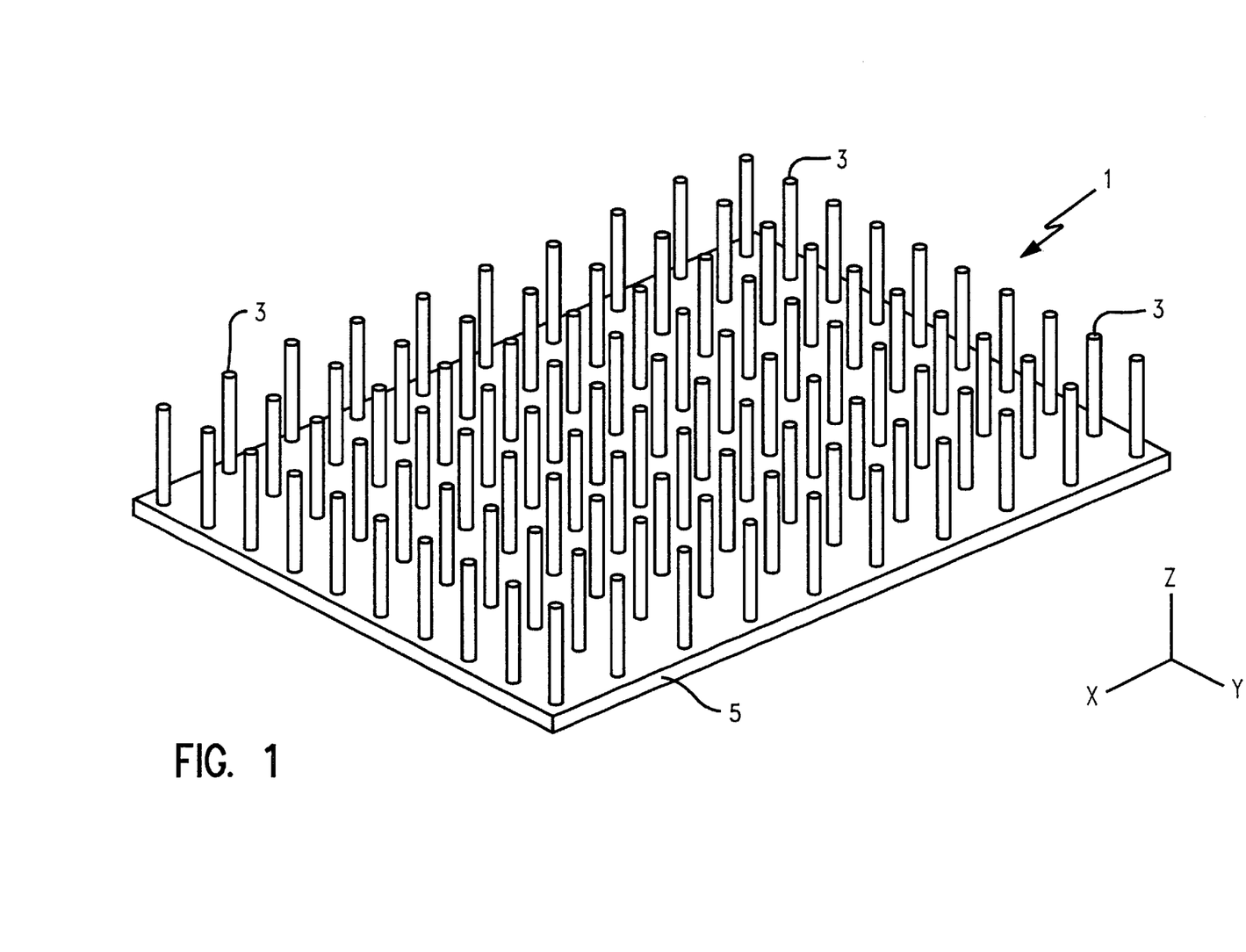
FIG. 1 shows a perspective view of a heat sink layer of pin fins formed on a base plate and extending from the X-Y plane of the plate into the Z direction.

With reference to FIG. 1, there is shown a perspective view of a typical heat sink layer 1 having pin fins formed on a base plate. Thus, as shown, an array of pin fins 3 extend from base plate 5 into the Z plane. Typically, the heat sink layer 1 may be made of a metal, such as aluminum, and may be formed, for example by extrusion or casting. It should be understood that the elements of the heat sink depicted in FIG. 1, as well as those depicted in FIGS. 2–8, are not to scale nor is their depiction intended to convey the relative proportions of these elements. These depictions are merely intended to aid in understanding the heat sink features in accordance with present invention. In this regard, the density and pitch of the array of pins 3 may be greater or less than shown, and the height and cross-sectional area of the pins may be varied. Although the cross-section of pins 3 are depicted as being round, other shapes, such as square or rectangular pins may be easier to fabricate, depending upon the manufacturing process employed.

Figure 2:
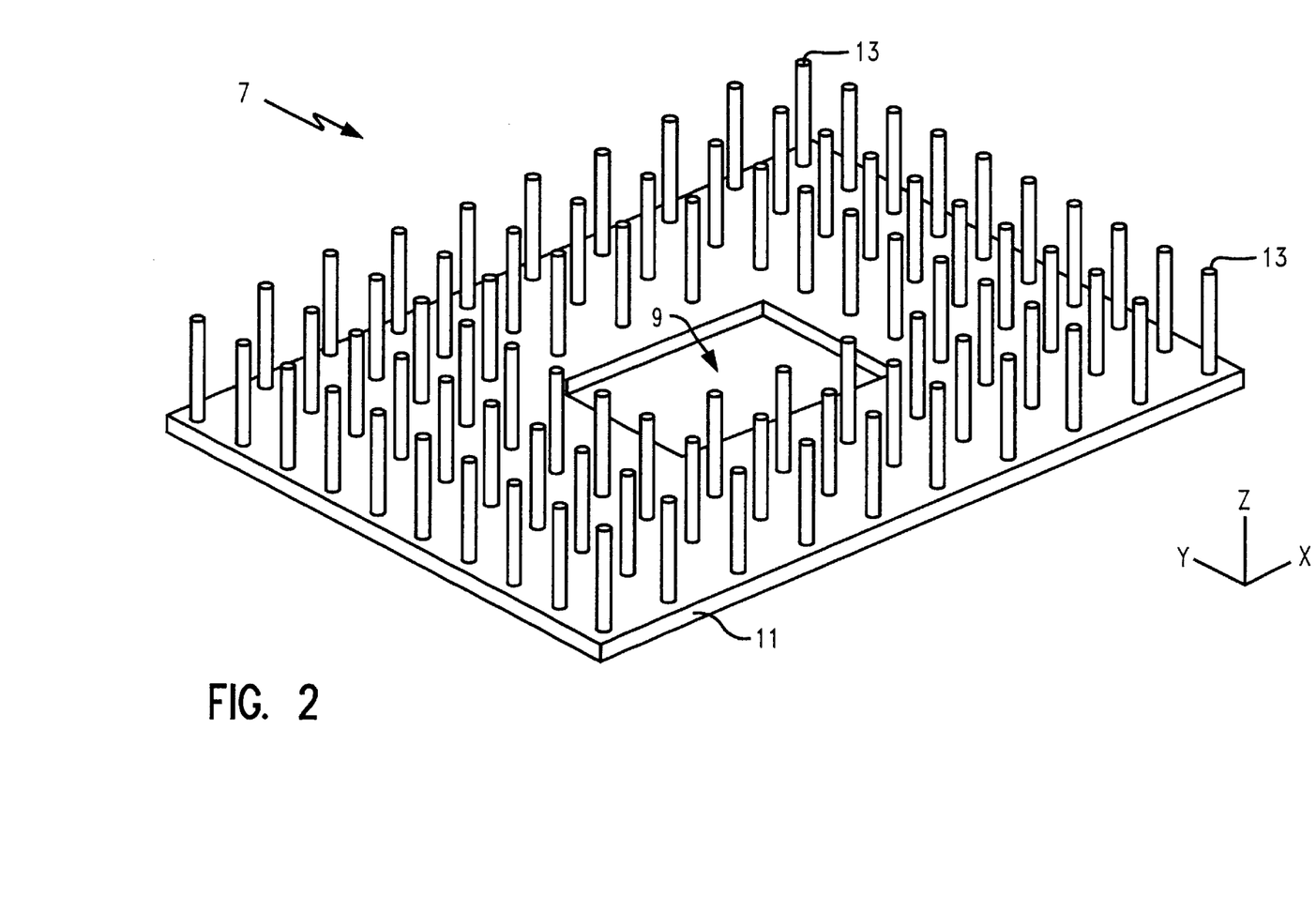
FIG. 2 shows a perspective view of a heat sink layer of pin-fins formed on a base plate and extending from the X-Y plane of the plate into the Z direction with an opening in the central portion which eliminates pins and a portion of the plate.

FIG. 2 shows a perspective view of a heat sink layer 7, similar to that shown in FIG. 1, having however, an opening 9 in the central region thereof. As shown, a square section of base plate 11, and pins 13 that would otherwise be formed thereon, have been removed. The size of opening 9 may be varied to achieve optimum performance in accordance with the particular application. Similarly, the shape of opening 9 may be varied such that it could be rectangular, round, triangular or some form of irregular shape.

Figure 3:
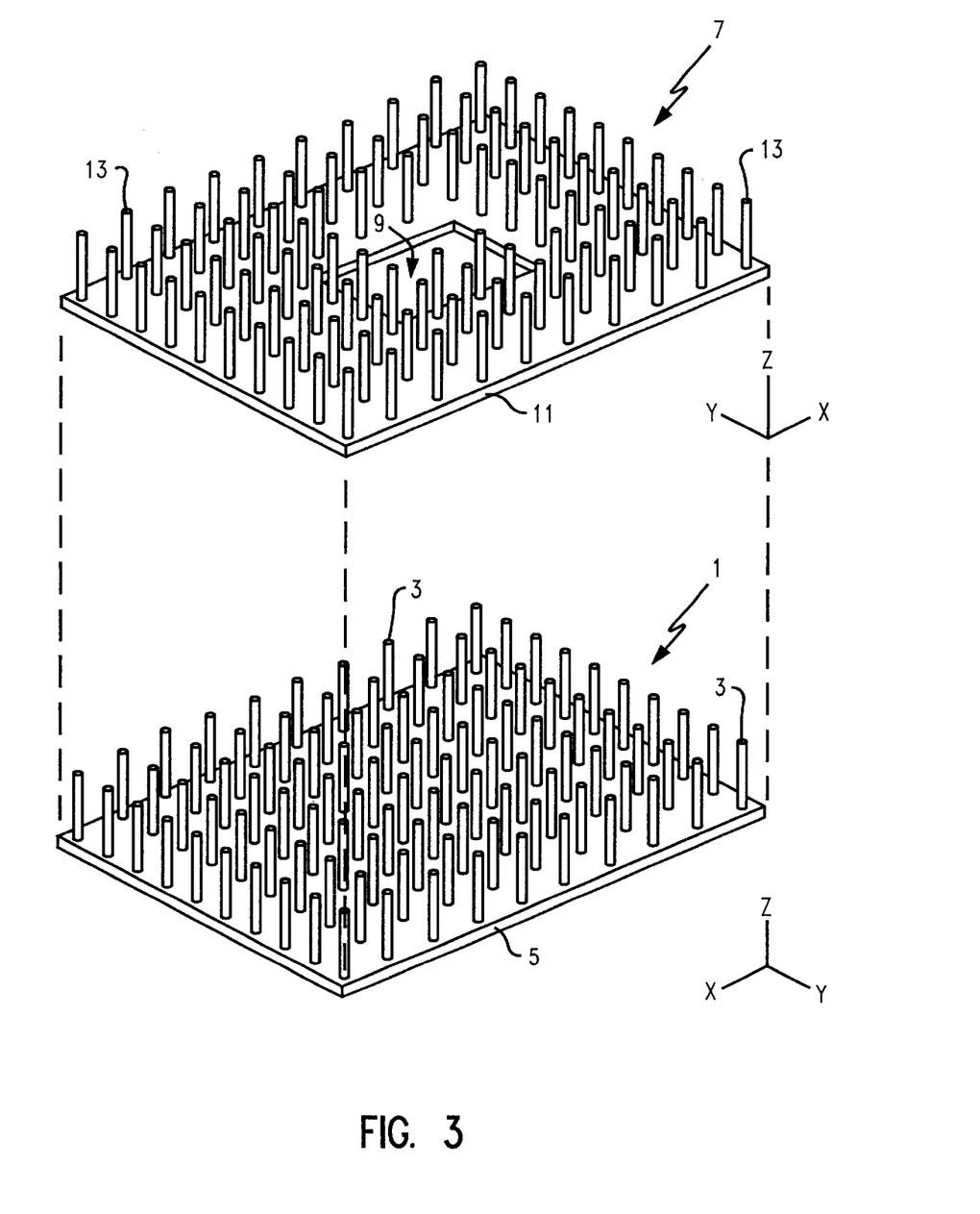
FIG. 3 shows a perspective view of the manner in which the heat sink layers of FIGS. 1 and 2 may be aligned to form the stacked arrangement of FIG. 4.
Figure 4:
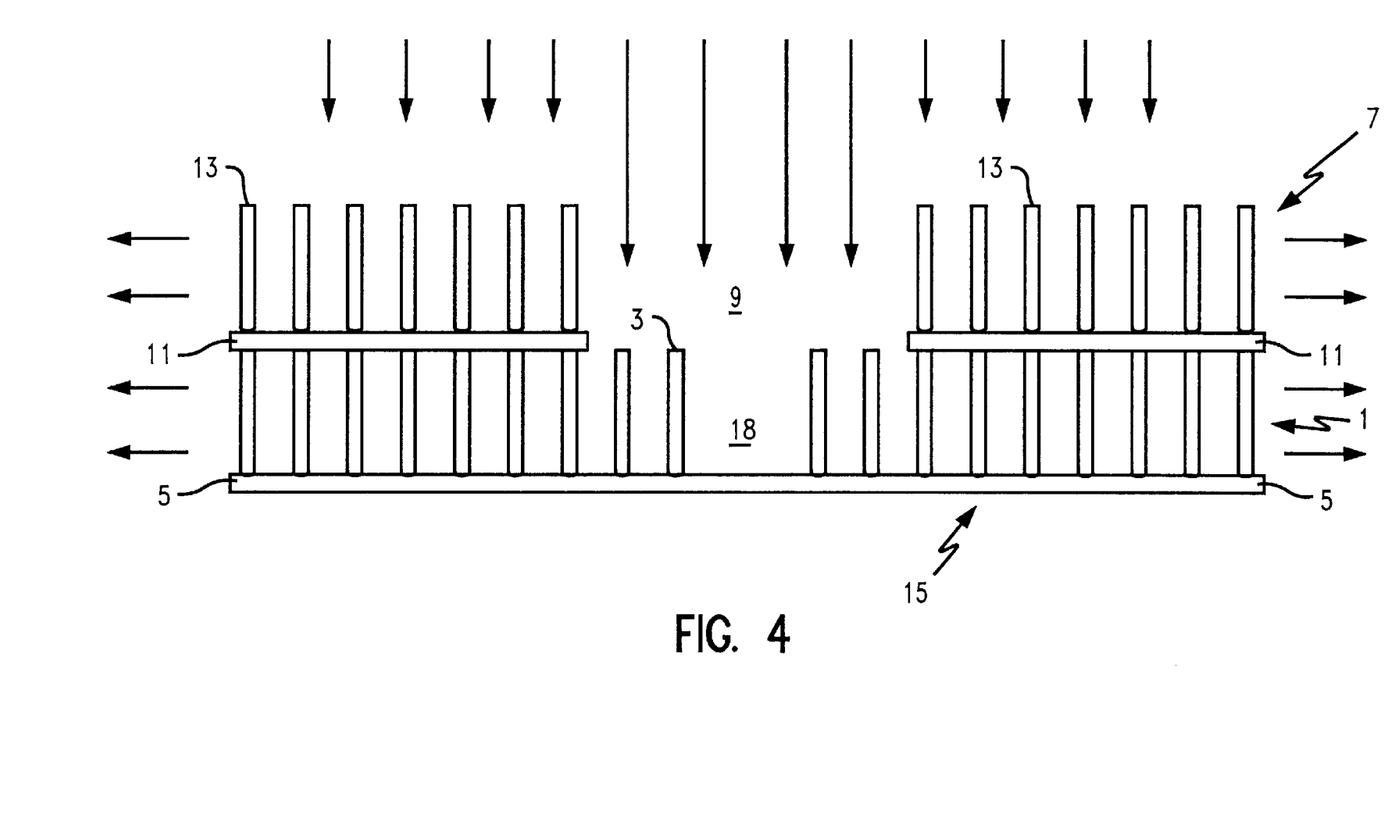
FIGS. 4 shows a cross-sectional view of the heat sink layers of FIGS. 1–3 as assembled to form a two-layer heat sink stack using forced air cooling.

FIG. 3 shows a perspective view of the manner in which the heat sink layers 1 and 7 of FIGS. 1 and 2 may be aligned to form the pyramidic stacked heat sink structure 15 shown in FIG. 4. Thus, heat sink layer 7 is aligned and mounted on heat sink layer 1. The base plate 11 of heat sink layer 7 may be bonded to the fin pins 3 of heat sink layer 1 with a high thermal conduction epoxy or with solder alloys (dip-brazing), as is well known to those skilled in the art.

The resulting stacked heat sink structure 15 is shown in the cross-sectional view of FIG. 4. It should be noted that pins 3 may be uniformly arranged on plate 5, as shown in FIGS. 1 and 3 or, alternatively, some pins 3 may be removed in the central portion 18, as shown in FIG. 4. It can be seen that fewer pins have been removed from plate 5 than have been removed from plate 11. Depending upon the application, a small opening (not shown), concentric with the pins removed from plate 5, may also be employed. However, where the application involves plate 5 in direct thermal contact with a continuous, flat surface, such as the surface of a cover plate or silicon chip, little benefit is obtained in having such an opening.

Figure 5:
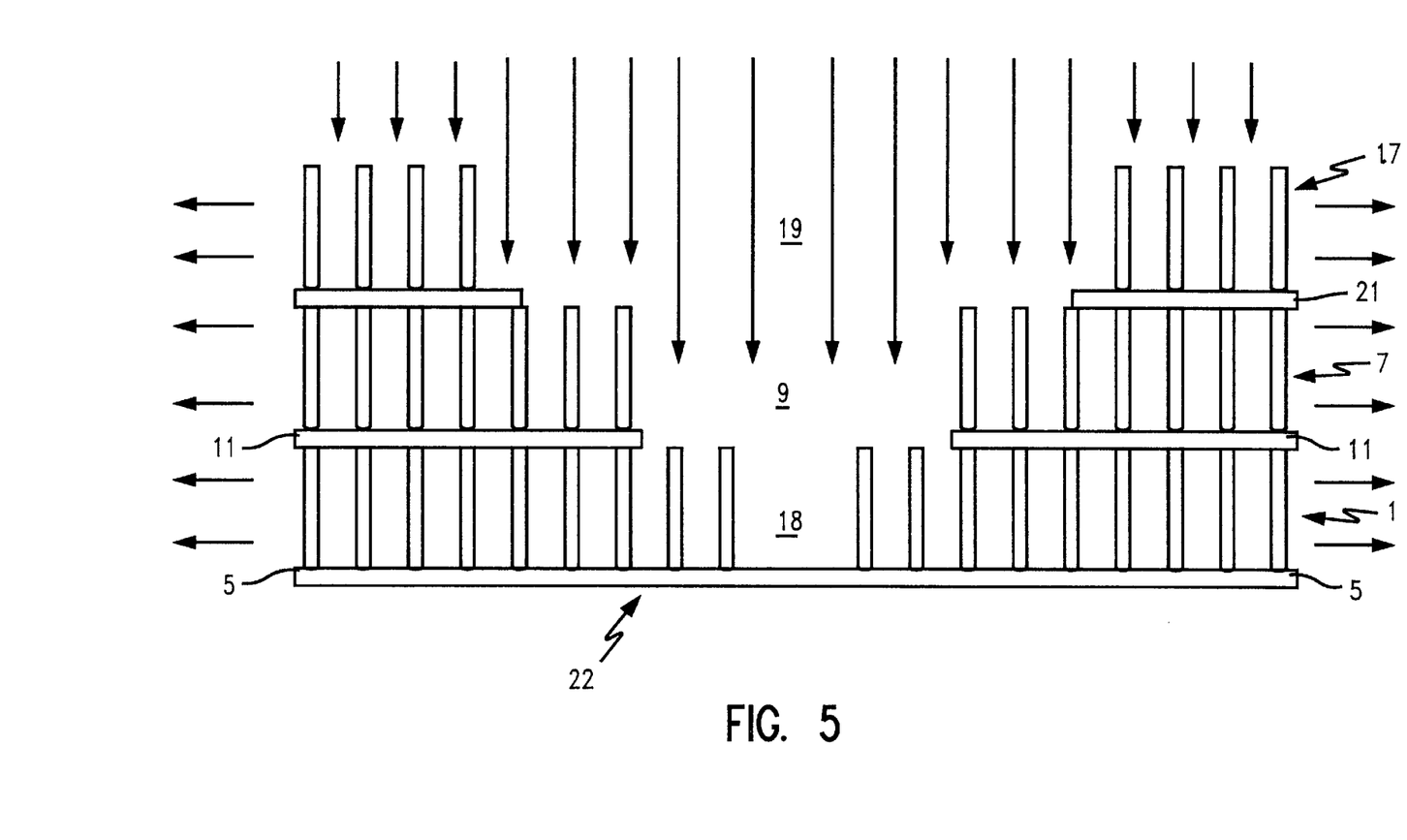
FIG. 5 shows a cross-sectional view of a three-layer heat sink stack using forced air cooling.
Figure 6:
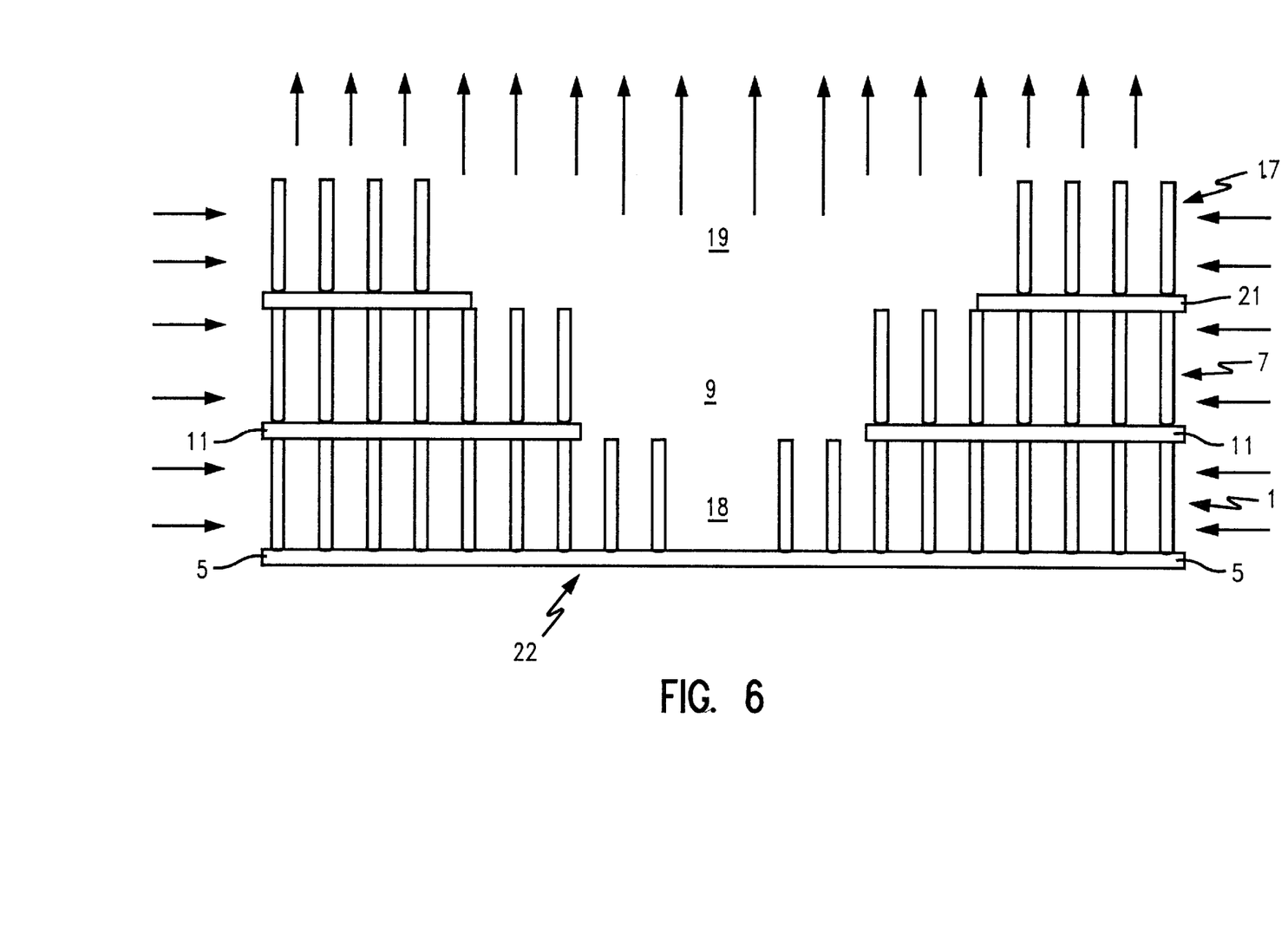
FIG. 6 shows a cross-sectional view of a three-layer heat sink stack using natural convection cooling.

By stacking the heat sink layers, as shown in FIG. 4, increased height in the vertical cooling surface is achieved in a simple manner. As shown in FIGS. 5 and 6, additional heat sink layers may be added to the stack in accordance with the requirements of the particular application being addressed so that three or four or more layers of heat sinks may be stacked in pyramidic fashion. Such an approach to gaining vertical cooling surface otherwise eliminates fabricating single layer tall fins with its attendant manufacturing difficulties. In this regard, the individual heat sink layers used to form the pyramidal stack in accordance with the present invention may be mass manufactured heat sinks formed by conventional extrusion or casting. These latter methods of manufacture do not allow for fabricating heat sinks with the high aspect ratios required for increased heat transfer in a constrained X-Y space. Although pin fins are shown in the stacked heat sinks of FIGS. 4–6, it is clear that plate fins, folded fins, corrugated fins, etc. could just as well be employed. The fins of all such arrangements would, in similar fashion to the disclosed pin fins, be vertical to its supporting base plate which base plate abuts the heat generating surface to be cooled.

The arrangement shown in FIG. 4 depicts cooling by forced air convection. In such a scheme and as shown by the arrows in FIG. 4, air is impinged upon the stacked heat sinks from the top. A portion of the airflow exits from the side of the top of heat sink layer 7. The remaining portion of the air passes through opening 9 in the base 11 of top layer 7 and impinges upon the bottom heat sink layer 1. The air then passes horizontally through the bottom heat sink layer and exits from the sides thereof.

FIG. 5 shows the cross-sectional arrangement of FIG. 4 with a third heat sink layer 17 stacked thereon to form stacked heat sink structure 22. As can be seen, the central opening 19 (with removed pins) in base plate 21 of heat sink layer 17 is concentric or centered with and larger than opening 9 (with removed pins) in base plate 11 of heat sink layer 7 and opening 9 in base plate 11 is, in turn, concentric or centered with and larger than the removed pin region 18 (and any small opening) in base plate 5. The arrangement of FIG. 5 also depicts cooling by forced convection. As shown by the arrows, the air flow pattern is the same as that shown and described with regard to FIG. 4 with the forced air here first impinging upon heat sink layer 17 with a portion of the air exiting through the sides of heat sink layer 17 and the remaining portion continuing through opening 19 in base plate 21 wherein a further portion of the air exits from the sides of heat sink layer 7, and so on.

It should be understood that not only do the progressively smaller openings in the stacked heat sink layers, as shown in the drawings, allow a portion of the air to flow laterally through the pin fins of each layer and out the sides, but the openings also reduce overall resistance thus increasing air flow in forced convection cooling (for a fixed pumping, power) to the remaining fins. Similarly, where convection cooling is through buoyancy-driven air flow conditions, the openings also reduce overall resistance to buoyant flow.

FIG. 6 depicts the structural arrangement of FIG. 5 using natural convection cooling. In this arrangement, air enters each of the layers of stacked heat sinks from the sides and moves through pin fins toward the center and then rises up through the respective openings 18, 9 and 18. As the air moves, it picks up heat from the pin fins and gets hotter. It is hottest when it reaches the central openings. The respective openings in the base plates allow the hot air to flow upward and away from the stacked heat sinks. The removal of fin pins in the central region increases overall efficiency by removing what would be the least efficient pin fins and reducing heat sink weight. Weight reduction is particularly advantageous in organic packaging where the stresses from the heat sink can alter the mechanics of the chip carrier.

It should be noted that the stacked heat sink structure in accordance with the present invention need not be limited to a single material. Accordingly, where required, the individual heat sink layers of the stacked heat sink structure can be of different materials/thicknesses so that the pyramidic heat sink structure attaches optimally with other mating surfaces with respect to thermomechanical properties. Thus, the material of the bottom most layer can be selected to have a CTE, for example, closely matching that of the adjacent chip or its cover plate. Typically, cover plates are made of copper or aluminum and the bottom layer of the heat sink stack could, similarly, be made of this material. Where the heat sink stack is directly bonded to the silicon chip, the bottom most layer of the heat sink stack could be made of silicon carbide to thereby minimize any CTE mismatch related strains in the bonded materials. The layers stacked upon the bottom most layer may be selected, in hierarchical form, to optimize cooling and minimize mismatch in thermomechanical properties from layer to layer.

In addition to the various layers of the heat sink stack being of different materials, each layer may be of a different fin type, shape or density. The shape of the central openings can also be different from layer to layer. Fin thickness, shape or density may be made to vary from layer to layer or can be made to vary within a given layer. Similarly, the size of central openings in the heat sink layers can be optimized to achieve a lower pressure drop in forced convection cooling where machines are used in an environment with strict pressure drop requirements.

Figure 7:
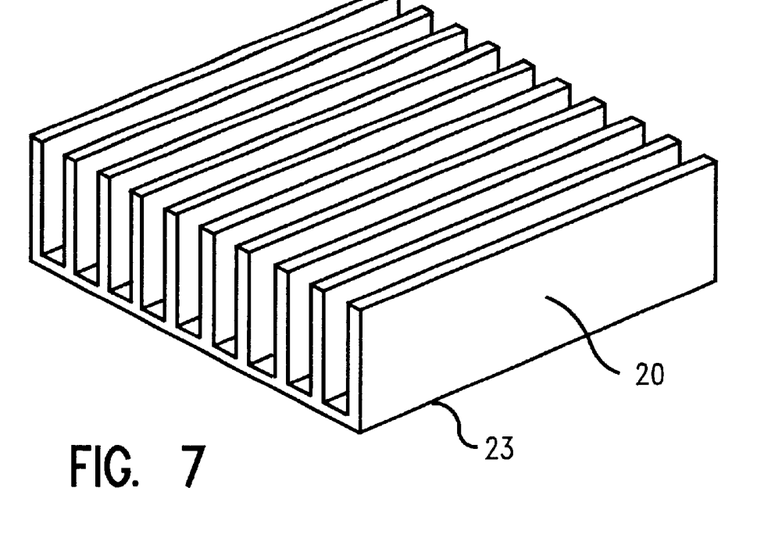
FIG. 7 shows a perspective view of a heat sink layer of vertical plate fins formed on a base plate and extending from the X-Y plane of the plate into the Z direction.
Figure 8:
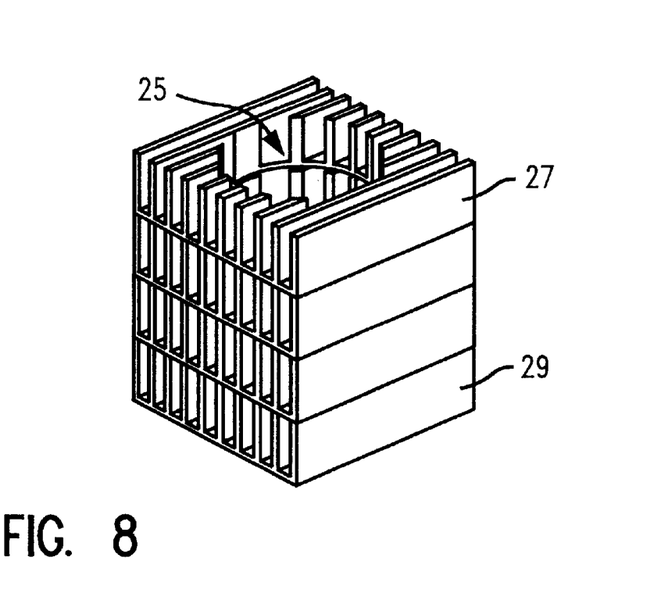
FIG. 8 shows a perspective view of the manner in which four layers of vertical plate fin heat sinks may be stacked with each ascending layer having a successively larger opening in central region thereof.

FIG. 7 shows a perspective view of a plate fm heat sink layer with an array of vertical plate fins 20 extending from base plate 23. FIG. 8 shows a perspective view of a four layer stack vertical plate fm heat sink structure, in accordance with the present invention. As shown in FIG. 8, the central opening region 25 in each layer is circular with each successive layer below the top layer 27 having a smaller concentric circular opening than the layer above. Bottom layer 29 may have an opening or may not, depending upon the particular application. Although the opening is shown as being circular, it is clear that any of a variety of opening shapes may be employed.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A heat sink structure, comprising:
   a first heat sink layer including a base plate supporting an array of vertically disposed heat dissipating elements extending therefrom; and
   at least a second heat sink layer arrangement comprising a plurality of heat sink layers each including a base plate having a central region with an opening therethrough and a region surrounding said central region supporting an array of vertically disposed heat dissipating elements extending therefrom, said plurality of heat sink layers forming a stack one on the other starting with said first heat sink layer and extending upward with the said opening in said base plate of each layer of said plurality of heat sink layers being aligned with and smaller than the opening in the base plate of the layer it supports in said stack.

2. The heat sink structure as set forth in claim 1 wherein the said base plate of said first heat sink layer is made of a material having thermomechanical properties closely matching those of the material to be cooled.

3. The heat sink structure as set forth in claim 1 wherein said vertically disposed heat dissipating elements of said first heat sink layer and said second heat sink layer arrangement are pin fins.

4. The heat sink structure as set forth in claim 1 wherein said vertically disposed heat dissipating elements of said first heat sink layer and said second heat sink layer arrangement are plate fins.

5. The heat sink structure as set forth in claim 1 wherein forced air is impinged on the top of said heat sink structure so as to flow into the said opening of said central region and out through said vertically disposed heat dissipating elements extending from said region surrounding said central region of each of said heat sink layers of said plurality of heat sink layers.

6. The heat sink structure as set forth in claim 1 wherein air in said array of vertically disposed heat dissipating elements extending from said region surrounding said central region of each of said plurality of heat sink layers flows into the said central region of each of said plurality of heat sink layers whereupon it flows upwards through the said opening of each of said plurality of heat sink layers.

7. Aid The heat sink structure as set forth in claim 1 wherein said first heat sink layer has a central region and a region surrounding said central region supporting said array of vertically disposed heat dissipating elements extending therefrom so as to leave said central region free of heat dissipating elements.

8. The heat sink structure as set forth in claim 7 wherein said heat dissipating elements of said first heat sink layer and said second heat sink layer arrangement are pin fins having a rectangular cross-section.

9. A heat sink structure, comprising:
   a bottom heat sink layer including a base plate supporting an array of vertically disposed heat dissipating elements;
   a plurality of further heat sink layers each including a base plate having a central region with an opening therethrough and a region surrounding said central region supporting an array of vertically disposed heat dissipating elements, said plurality of further heat sink layers forming a stack of heat sink layers one on the other starting with said bottom heat sink layer with the said opening of the said base plate of each layer of said plurality of heat sink layers being aligned with and smaller than the said opening of the said base plate of the layer it supports in said stack.

10. The heat sink structure as set forth in claim 9 wherein said stack of heat sink layers is formed of a composite of materials.

11. The heat sink structure as set forth in claim 10 wherein said bottom heat sink layer is in contact with a heat generating surface and is made of a material having thermomechanical characteristics closely matching those of the material of said heat generating surface.

12. The heat sink structure as set forth in claim 11 wherein said bottom heat sink layer is SiC.

13. The heat sink structure as set forth in claim 11 wherein said bottom heat sink layer is aluminum.

14. A method of forming a heat sink structure having extended vertical cooling elements comprising:
   forming a bottom heat sink layer including a base plate supporting an array of vertically disposed heat dissipating elements extending therefrom;

forming a plurality of further heat sink layers each having a base plate supporting an array of a vertically disposed heat dissipating elements extending therefrom with each of said base plates having a different size central portion thereof removed to form different size openings therein; and stacking said plurality of further heat sink layers one on the other to form a stack on said bottom heat sink layer so that each heat sink layer of said plurality of further heat sink layers in the stack supports a heat sink layer having a larger opening in its base plate.

15. The method as set forth in claim 14 wherein the said base plate of said bottom heat sink layer is in contact with heat generating material and is made of a material having a CTE closely matching the CTE of said heat generating material.

16. The method as set forth in claim 14 wherein said plurality of further heat sink layers stacked one on the other are formed from different materials.

17. The method as set forth in claim 15 wherein the said base plate of said bottom heat sink is made of SiC.

18. The method as set forth in claim 14 wherein convection cooling is carried out by forcing air onto the top of said stack and into said openings so as to flow out the sides of each of said plurality of heat sink layers of said stack.

* * * * *